(12) United States Patent
Chang et al.

(10) Patent No.: US 8,975,807 B2
(45) Date of Patent: Mar. 10, 2015

(54) ORGANIC LIGHT EMITTING DEVICE

(71) Applicants: Chia-Hsiung Chang, Tainan (TW); Wen-Chun Wang, Taichung (TW)

(72) Inventors: Chia-Hsiung Chang, Tainan (TW); Wen-Chun Wang, Taichung (TW)

(73) Assignees: Dongguan Masstop Liquid Crystal Display Co., Ltd., Guangdong Province (CN); Wintek Corporation, Taichung (TW)

( * ) Notice: Subject to any disclaimer, the term of this patent is extended or adjusted under 35 U.S.C. 154(b) by 193 days.

(21) Appl. No.: 13/831,970

(22) Filed: Mar. 15, 2013

(65) Prior Publication Data

US 2013/0249376 A1    Sep. 26, 2013

(30) Foreign Application Priority Data

Mar. 21, 2012    (TW) .............................. 101109709 A (51) Int. Cl.
*F21V 5/00* (2006.01)
*H05B 33/00* (2006.01)
*H01L 51/52* (2006.01)

(52) U.S. Cl.
CPC ................ *F21V 5/002* (2013.01); *H01L 51/52* (2013.01); *H01L 51/5275* (2013.01); *H01L 51/524* (2013.01); *H01L 2251/5315* (2013.01)
USPC ........................ 313/110; 362/311.01; 362/326

(58) Field of Classification Search
None
See application file for complete search history.

(56) References Cited

U.S. PATENT DOCUMENTS

| 7,241,559 | B2 | 7/2007 | Borrelli et al. |
| 2003/0020399 | A1 | 1/2003 | Moller et al. |
| 2007/0285000 | A1* | 12/2007 | Lim et al. ...................... 313/501 |
| 2008/0225506 | A1* | 9/2008 | Huang et al. .................... 362/19 |
| 2008/0247191 | A1* | 10/2008 | Hsu ................. 362/612 |
| 2010/0201256 | A1 | 8/2010 | Xue et al. |
| 2014/0254170 | A1* | 9/2014 | Celentano et al. ............ 362/297 |

* cited by examiner

*Primary Examiner* — Ashok Patel
(74) *Attorney, Agent, or Firm* — Jianq Chyun IP Office (57) ABSTRACT

An organic light emitting device including a first substrate, a second substrate parallel to the first substrate, and an organic light emitting unit disposed between the first substrate and the second substrate is provided. The first substrate has a plurality of first light guiding microstructures. A distribution density of the first light guiding microstructures is in a range of 100 to 2000 pcs/mm, wherein the first light guiding microstructures are located inside the first substrate and a material of the first substrate includes a photosensitive material.

18 Claims, 6 Drawing Sheets

ORGANIC LIGHT EMITTING DEVICE

CROSS-REFERENCE TO RELATED APPLICATION

This application claims the priority benefit of Taiwan application serial no. 101109709, filed on Mar. 21, 2012. The entirety of the above-mentioned patent application is hereby incorporated by reference herein and made a part of this specification.

BACKGROUND OF THE INVENTION

1. Field of the Invention

The invention relates to a light emitting device. More particularly, the invention relates to an organic light emitting device.

2. Description of Related Art

The organic light emitting device (OLED), with advantages such as self-luminescence, wide view angle, low power consumption, simple manufacturing process, low cost, low operation temperature range, high responsive speed and full colors, has a great potential of becoming the mainstream flat panel display product in its next generation.

In general, the organic light emitting device includes a first substrate, an organic light emitting unit disposed on the first substrate, and a second substrate sealing and packaging the organic light emitting unit with the first substrate, wherein the organic light emitting unit includes a light emitting layer sandwiched between two electrodes. A light emitted from the light emitting layer may be restricted inside the organic light emitting device owing to the total internal reflection (TIR) effect of the substrate when the light emits obliquely out from the first substrate or the second substrate at large angle so that the light emitting efficiency of the organic light emitting device is limited.

Recently, the light emitting efficiency of the organic light emitting device has been improved by several techniques. For example, a micro lens array or a plurality of microstructures is provided to be formed on the surface of the substrate by an adhesion process. Nevertheless, this method may be unfavorable to the fabrication of the organic light emitting device because of the misalignment and the poor adhesion between the substrate and the microstructure during the additional adhesion process. Alternately, a layer of photonic crystal structure or a grating with low refractive index is provided to be disposed between the substrate and the light emitting layer. However, the film layer uniformity of the organic light emitting unit formed on the layer of photonic crystal structure or the grating with low refractive index is poor to cause an over large electric field in a particular region, which may shorten the lifetime of the organic light emitting device. Accordingly, the issue of the organic light emitting device to be overcome by the researchers lies in the improvement of the light emitting efficiency without influencing on the lifetime and complicating the fabrication thereof.

SUMMARY OF THE INVENTION

The invention is provided to an organic light emitting device with desirable light emitting efficiency.

The invention is directed to an organic light emitting device including a first substrate, a second substrate parallel to the first substrate, and an organic light emitting unit disposed between the first substrate and the second substrate. The first substrate has a plurality of first light guiding microstructures. A distribution density of the first light guiding microstructures is in a range of 100 to 2000 pcs/mm, wherein the first light guiding microstructures are located inside the first substrate and a material of the first substrate includes a photosensitive material.

According to an embodiment of the invention, the photosensitive material includes rare metals, gold, silver, or a combination thereof.

According to an embodiment of the invention, a refractive index of the first substrate is in a range of 1.3 to 2.0.

According to an embodiment of the invention, the first light guiding microstructures are distributed periodically.

According to an embodiment of the invention, the distribution density of the periodically distributed first light guiding microstructures is in a range of 100 to 600 pcs/mm.

According to an embodiment of the invention, the first light guiding microstructures are distributed non-periodically.

According to an embodiment of the invention, the distribution density of the non-periodically distributed first light guiding microstructures is in a range of 1000 to 2000 pcs/mm.

According to an embodiment of the invention, shapes of the first light guiding microstructures include rectangles, semicircles, triangles, or step-like shapes.

According to an embodiment of the invention, the second substrate has a plurality of second light guiding microstructures. The distribution density of the second light guiding microstructures is in a range of 100 to 2000 pcs/mm. The second light guiding microstructures are located inside the second substrate and a material of the second substrate includes a photosensitive material.

According to an embodiment of the invention, the photosensitive material includes rare metals, gold, silver, or a combination thereof.

According to an embodiment of the invention, a refractive index of the second substrate is in a range of 1.3 to 2.0.

According to an embodiment of the invention, the second light guiding microstructures are distributed periodically.

According to an embodiment of the invention, the distribution density of the periodically distributed second light guiding microstructures is in a range of 100 to 600 pcs/mm.

According to an embodiment of the invention, the second light guiding microstructures are distributed non-periodically.

According to an embodiment of the invention, the distribution density of the non-periodically distributed second light guiding microstructures is in a range of 1000 to 2000 pcs/mm.

According to an embodiment of the invention, shapes of the second light guiding microstructures include rectangles, semicircles, triangles, or step-like shapes.

According to an embodiment of the invention, the organic light emitting unit includes a first electrode, a second electrode, and a light emitting layer. The second electrode is disposed parallel to the first electrode, and the light emitting layer is disposed between the first electrode and the second electrode, wherein at least one of the first electrode and the second electrode is a transparent electrode.

According to an embodiment of the invention, the organic light emitting unit is a passive organic light emitting unit.

According to an embodiment of the invention, the organic light emitting unit is an active organic light emitting unit.

According to an embodiment of the invention, the organic light emitting device further includes an active device for driving the organic light emitting unit.

In view of the foregoing, the organic light emitting device according to an embodiment of the invention has the light guiding microstructures inside the substrate, which facilitates to mitigate the TIR effect of the light emitted from the light emitting layer in the substrate when the light is obliquely emitted out from the substrate at a large angle, such that the light restricted inside the organic light emitting device is to reduce for improving the light emitting efficiency. In addition, the light guiding microstructures is formed inside the substrate rather than on the surface of the substrate. The surface uniformity of the substrate is not deteriorated owing to the configuration of the light guiding microstructures so that the problems such as the over large electric field at specific region and the shortening of the life time of the organic light emitting device are mitigated. Furthermore, the light guiding microstructures according to the embodiment of the invention are not formed on the surface of the substrate and/or other film layers by performing an adhesion process, and thus the misalignment between the microstructures and the substrate is not considered.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
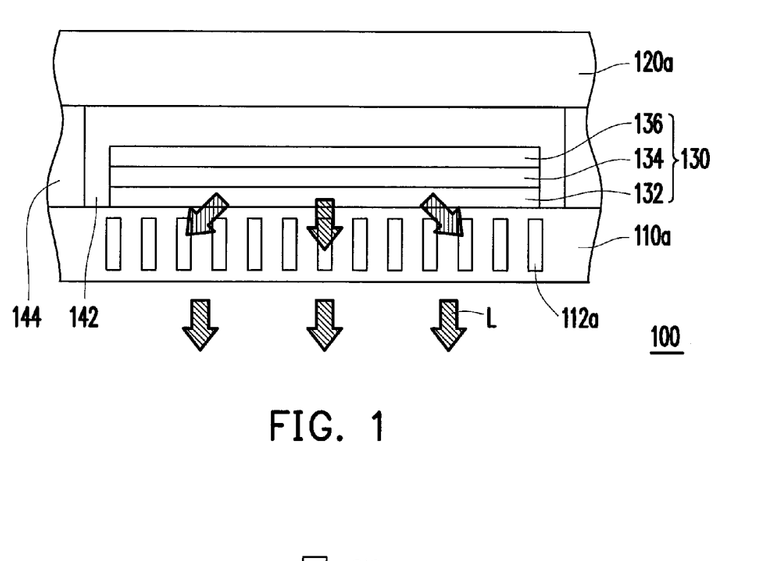
FIG. 1 illustrates a schematic cross-sectional view of an organic light emitting device according to an embodiment of the invention.

FIG. 1 illustrates a schematic cross-sectional view of an organic light emitting device according to an embodiment of the invention.

Referring to FIG. 1, an organic light emitting device 100 according to the embodiment includes a first substrate 110a, a second substrate 120a, and an organic light emitting unit 130, wherein the second substrate 120a and the first substrate 110a are parallel to each other and the organic light emitting unit 130 is disposed between the first substrate 110a and the second substrate 120a. In the present embodiment, the organic light emitting unit 130 is, for example, disposed on the first substrate 110a, but the invention is not limited thereto. In other embodiments, the organic light emitting unit 130 can be selectively disposed on the second substrate 120a.

Specifically, the organic light emitting device 100 further includes a filling material 142 and a sealant 144. The filling material 142 is filled in a space between the first substrate 110a and the second substrate 120a, wherein the material of the filling material 142 can be noble gas, optical glue, or any other material capable of protecting the organic light emitting unit 130. The sealant 144 is applied between the first substrate 110a and the second substrate 120a to surround the space for filling the filling material 142, which protects the organic light emitting unit 130 from the intruding gas or vapor that may influence the characteristics and the lifetime of the organic light emitting device 100 and fixes the organic light emitting device 100. It is noted that the second substrate 120a and the sealant 144 can be replaced by a packaging cover in other embodiments for sealing the organic light emitting unit 130 thereinside.

Moreover, the organic light emitting unit 130 includes a first electrode 132, a light emitting layer 134, and a second electrode 136. According to the embodiment, the first electrode 132 is disposed on the first substrate 110a, the second electrode 136 and the first electrode 132 are parallel to each other, and the light emitting layer 134 is disposed between the first electrode 132 and the second electrode 136. Besides, at least one of the first electrode 132 and the second electrode 136 is a transparent electrode.

In the present embodiment, the organic light emitting device 100 can be designed as a bottom emission type light emitting structure so that the first electrode 132 is the transparent electrode for allowing the light L emitted from the light emitting layer 134 to be emitted out of the organic light emitting device 100 at the side where the first electrode 132 is located. In the present embodiment, the first substrate 110a is the transparent substrate for allowing the emission of the light L. It is noted that the light transparencies or the materials of the second electrode 136 and the second substrate 120a in the organic light emitting device 100 according to the present embodiment are not particularly restricted. The material of the second electrode 136 can be conductive materials with good light transparency or poor light transparency. The second substrate 120a can selectively be a transparent glass substrate or an opaque silicon substrate, but the invention is not limited thereto.

Figure 2:
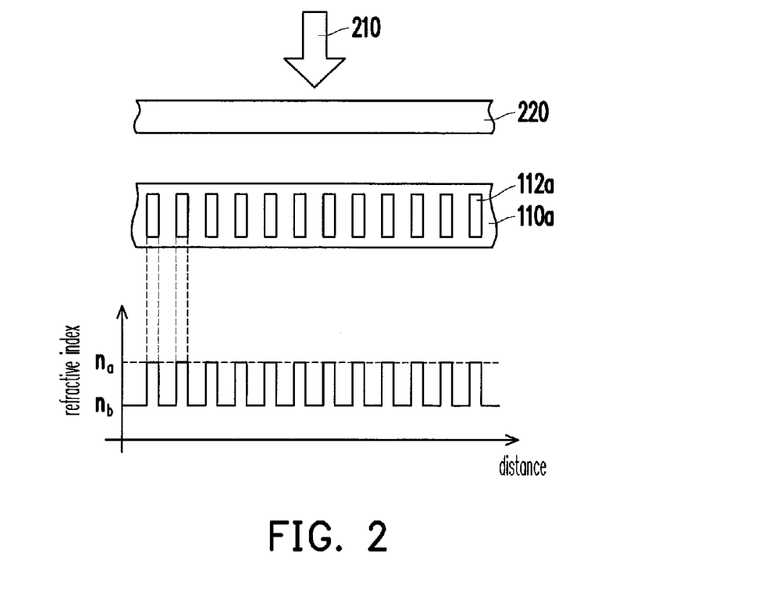
FIG. 2 is a schematic view showing the fabrication of the first substrate and a refractive index distribution of the first substrate according to an embodiment of the invention.

Furthermore, the first substrate 110a can have a plurality of first light guiding microstructures 112a located within (inside) the first substrate 110a. The fabrication of the first light guiding microstructures 112a is described in the following accompanying with FIG. 2. FIG. 2 is a schematic view showing the fabrication of the first substrate and a refractive index distribution of the first substrate according to an embodiment of the invention. Referring to FIG. 1 and FIG. 2, the material of the first substrate 110a can include the photosensitive material such as rare metals, gold, silver, or a combination thereof. The fabrication of the first light guiding microstructures 112a can include providing a light source 210 to pass through a patterned mask 220 and subsequently irradiate on the first substrate 110a so that the photosensitive material is reacted in response to the incident light source 210 and the first light guiding microstructures 112a are thus formed inside the first substrate 110a. Accordingly, no photoresist is required to be formed on the first substrate 110a for forming the first light guiding microstructures 112a, which means that the direct exposure is performed for forming the first light guiding microstructures 112a by the use of the mask.

The light source 210 can be an ultra-violet (UV) light and the patterned mask 220 can be a gray-tone mask. However, the invention is not limited thereto. In other embodiments, the light source and the patterned mask can be modified by the person who has ordinary skill in the art for forming the light guiding microstructures inside the substrate. The wavelength of the light source 210 or the pattern design of the mask 220 is not particularly restricted. It is noted that the wavelength of the light source 210 can be adjusted or selected according to the property of the photosensitive material.

In the present embodiment, the first light guiding microstructures 112a are formed inside the first substrate 110a by the light irradiation. Therefore, no development agent or etchant is needed to form the first light guiding microstructures 112a so that the surface flatness of the first substrate 110a is not influenced by the fabrication of the first light guiding microstructures 112a. The over large electric field or the lifetime shortening of the organic light emitting device 100 caused by the poor surface evenness of the first substrate 110a is mitigated according to the present embodiment. In addition, the first light guiding microstructures 112a need not be adhered on the surface of the first substrate 110a and/or between other film layers, and thus the problems owing to the misalignment during the adhesion process does not exist.

In specific, the design of the patterned mask 220 includes that the transparencies in different regions are various, so that the first light guiding microstructures 112a can be formed by irradiating the light source 210 passing through the mask 220 on the first substrate 110a. The shapes of the first light guiding microstructures 112a are the rectangles, for example, but the present invention is not limited thereto. As for the first substrate 110a, the refractive index $n_a$ of the region having the first light guiding microstructures 112a formed by the irradiation of the light source 210 and the refractive index $n_b$ of the region which is not irradiated by the light source 210 are different. Accordingly, the refractive index of the first substrate 110a can be in a range of 1.3 to 2.0. In other words, the refractive index of the first substrate 110a itself is not restricted to be consistent at a single value.

It is noted that the refractive index $n_a$ of the region having the first light guiding microstructures 112a formed by the irradiation of the light source 210 and the refractive index $n_b$ of the region which is not irradiated by the light source 210 are different so that the organic light emitting device 100 facilitates to refract the light L at large angle. Therefore, less portion of the light L emitted from the light emitting layer 134 is restricted inside the organic light emitting device 100 owing to the TIR effect of the first substrate 110a when the light L emits out of the first substrate 110a at a large angle. Herein, the amount and the locations of the first light guiding microstructure 112a are not particularly limited in the invention.

In an example, the first light guiding microstructures 112a can be evenly distributed inside the first substrate 110a. Owing that the first light guiding microstructures 112a are used for refracting the light L at the large angle, the first light guiding microstructures 112a can selectively be configured at the region outside the orthogonal projection of the organic light emitting unit 130 on the first substrate 110a, but the invention is not limited thereto.

Furthermore, by modifying the pattern design of the patterned mask 220, the distribution density of the first light guiding microstructures 112a can be changed. In one instance, the distribution density of the first light guiding microstructures 112a can be in a range of 100 to 2000 pcs/mm. The distribution density of the first light guiding microstructures is further described in the following accompanying with FIG. 2 and FIG. 3.

Referring to FIG. 2, the first light guiding microstructures 112a of the embodiment are distributed periodically. In this embodiment, the distribution density of the first light guiding microstructures 112a is in a range of 100 to 600 pcs/mm and the periodically distributed first light guiding microstructures 112a renders the refractive index of the first substrate 110a to be presented in a periodical variance. Particularly, the region configured with the first light guiding microstructures 112a and the region without the first light guiding microstructures 112a are alternatively arranged. Accordingly, the first substrate 110a has the optical characteristic of refractive index $n_a$ and refractive index $n_b$ alternatively distributed.

Figure 3:
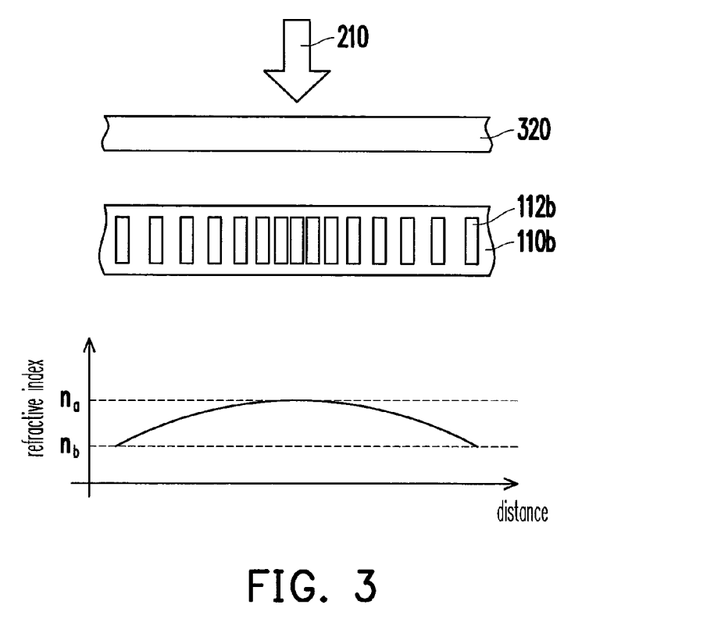
FIG. 3 is a schematic view showing the fabrication of the first substrate and a refractive index distribution of the first substrate according to another embodiment of the invention.

In addition to the descriptions in above, the first light guiding microstructures 112a can render the first substrate 110a to have the gradually and smoothly changed refractive index distribution. FIG. 3 is a schematic view showing the fabrication of the first substrate and a refractive index distribution of the first substrate according to another embodiment of the invention.

Referring to FIG. 3, by modifying the non-periodical pattern design of the patterned mask 320, the light source 210 passing through the patterned mask 320 and subsequently irradiating on the first substrate 110b facilitates to render the first substrate 110b to have the gradually changed refractive index distribution. In the present embodiment, the refractive index distribution of the first substrate 110a is gradually decreased from the refractive index $n_a$ at the region where the first light guiding microstructures 112b are located to the refractive index $n_b$ at the regions which are not irradiated by the light L and located at the two opposite sides of the region where the first light guiding microstructures 112b are located. Furthermore, the distribution density of the first light guiding microstructures 112b in the first substrate 110b can be 1000 to 2000 pcs/mm. Herein, the refractive index $n_a$ and the refractive index $n_b$ are exemplarily provided for showing the variance of the refractive index of the first substrate 110b. However, the values of the refractive index $n_a$ and the refractive index $n_b$ are determined according to the material of the first substrate 110b, which are by no means to limit the invention.

In addition, the pattern of the patterned mask 320 or the irradiating time of the light source 210 can be adjusted to change the shape and the position of the first light guiding microstructures 112b inside the first substrate 110b. For example, the shape of the first light guiding microstructures 112b can be other shapes in addition to the rectangles as shown in FIG. 3. The shapes of the first light guiding microstructures 112b are further described in the following accompanying with FIG. 4 to FIG. 6.

Figure 4:
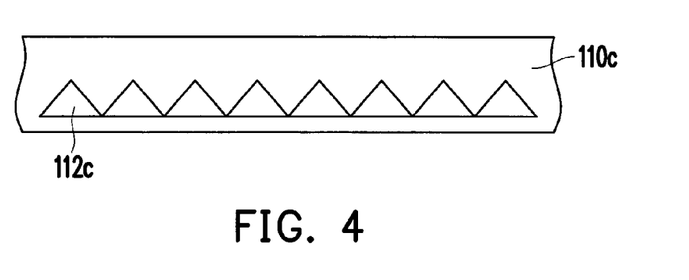
FIG. 4 to FIG. 6 are schematic views of the first light guiding microstructures with different shapes.
Figure 5:
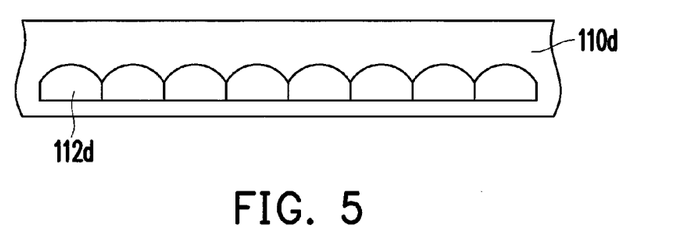
Figure 6:
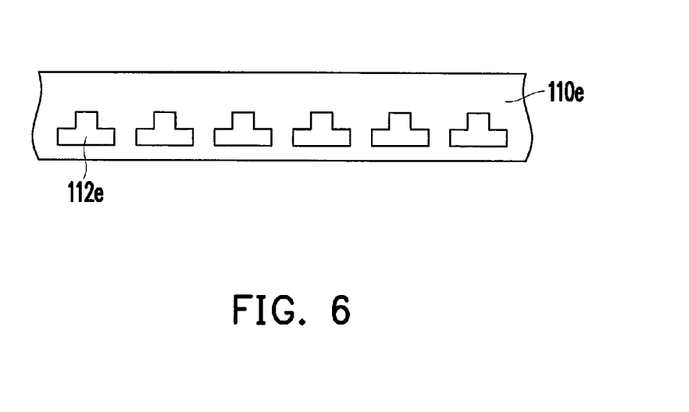

FIG. 4 to FIG. 6 are schematic views of the first light guiding microstructures with different shapes. Referring to FIG. 4, the first light guiding microstructures 112c inside the first substrate 110c according to the present embodiment are triangles connected continuously, but the invention is not limited thereto. In other embodiments, the triangular first light guiding microstructures 112c can be separated arranged. Accordingly, the two adjacent first light guiding microstructures 112c can be separated by a distance without connecting together. Referring to FIG. 5, the first light guiding microstructures 112d inside the first substrate 110d according to the present embodiment are semicircles connected continuously. The semicircle herein means that the geometrical structure is a portion of a circle and the semicircle need not be just a half (50%) of a circle. Referring to FIG. 6, the first light guiding microstructures 112e inside the first substrate 110e according to the present embodiment are step-like shapes and the numbers of the steps and the height of each step are not limited in the invention.

Figure 7:
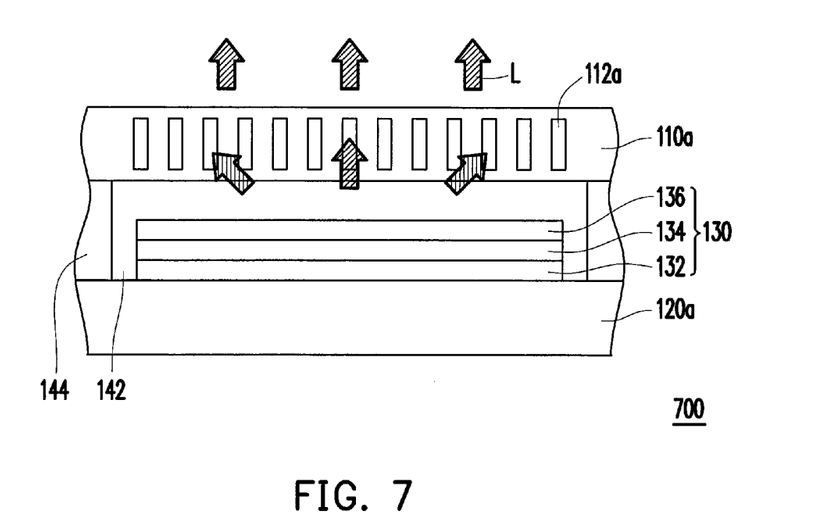
FIG. 7 illustrates a schematic cross-sectional view of an organic light emitting device according to another embodiment of the invention.

In addition, the organic light emitting device can selectively be a light emitting structure of the top emission type rather than the bottom emission type. FIG. 7 illustrates a schematic cross-sectional view of an organic light emitting device according to another embodiment of the invention.

Referring to FIG. 7, the organic light emitting device 700 of the present embodiment is similar to the organic light emitting device 100 depicted in FIG. 1, wherein the like reference numbers represent the like elements and are not iterated here. The difference between the two embodiments mainly lies in that the organic light emitting unit 130 of the organic light emitting device 700 according to the present embodiment is disposed on the second substrate 120a. In the present embodiment, the organic light emitting device 700 can be designed as the top emission type light emitting structure so that the second electrode 136 is the transparent electrode and the light transparency or the material of the first electrode 132 is not particularly limited for allowing the light L emitted from the light emitting layer 134 to be emitted out of the organic light emitting device 700 at the side where the second electrode 136 is located.

Figure 8:
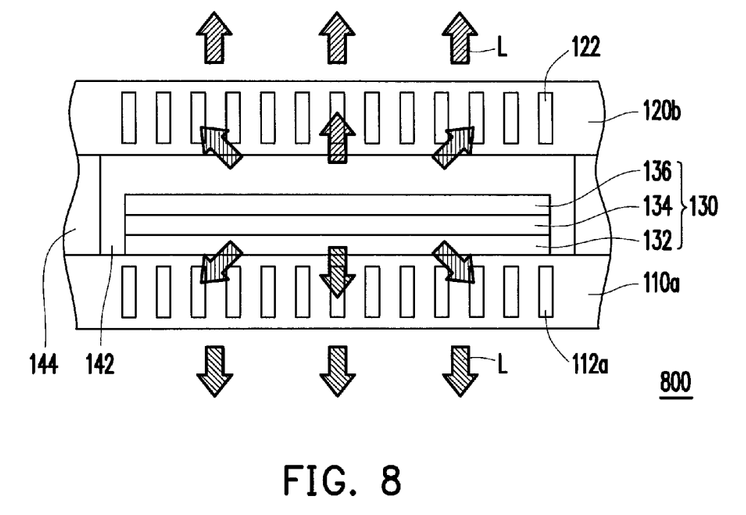
FIG. 8 illustrates a schematic cross-sectional view of an organic light emitting device according to further another embodiment of the invention.

In addition, the organic light emitting device can selectively be a light emitting structure of the dual side emission type in addition to the top emission type and the bottom emission type. FIG. 8 illustrates a schematic cross-sectional view of an organic light emitting device according to further another embodiment of the invention.

Referring to FIG. 8, the organic light emitting device 800 of the present embodiment is similar to the organic light emitting device 100 depicted in FIG. 1, wherein the like reference numbers represent the like elements and are not iterated here. The difference between the two embodiments mainly lies in that the second substrate 120b of the organic light emitting device 800 has a plurality of second light guiding microstructures 122, wherein the material of the second substrate 120b and/or the configuration of the second light guiding microstructures 122 are/is similar to the first light guiding microstructure and/or the first substrate as depicted in FIG. 1. In addition, the fabrication of the second light guiding microstructures 122 and/or the function thereof are/is similar to the first light guiding microstructures 112a depicted in FIG. 2. Accordingly, the elements can be referred to FIG. 1 and FIG. 2 and are not reiterated here.

In the present embodiment, the organic light emitting device 800 can be designed as a top and bottom emission type light emitting structure so that the first electrode 132 and the second electrode 136 are the transparent electrodes for allowing the light L emitted from the light emitting layer 134 to be emitted out of the organic light emitting device 800 at the two sides where the first electrode 132 and the second electrode 136 are located.

Furthermore, in other embodiments, the organic light emitting device can further include an active device for driving the organic light emitting unit. For example, FIG. 9 illustrates a schematic cross-sectional view of an organic light emitting device according to further another embodiment of the invention.

Figure 9:
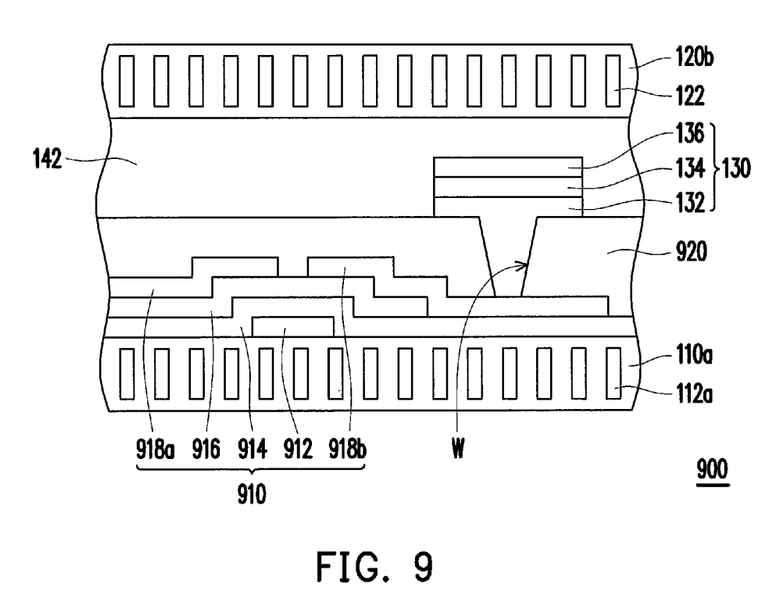
FIG. 9 illustrates a schematic cross-sectional view of an organic light emitting device according to further another embodiment of the invention.

Referring to FIG. 9, the organic light emitting device 900 of the present embodiment is similar to the organic light emitting device 800 depicted in FIG. 8, wherein the like reference numbers represent the like elements and are not iterated here. The difference between the two embodiments mainly lies in that the organic light emitting device 900 further includes an active device 910 for driving the organic light emitting unit 130.

In the present embodiment, the active device 910 includes a gate 912, a gate insulation layer 914, a semiconductor channel 916, a source 918a and a drain 918b. The gate 912 is disposed on the first substrate 110a, and the gate insulation layer 914 is disposed on the first substrate 110a and covers the gate 912. The semiconductor channel 916 is disposed on the gate insulation layer 914 and an orthogonal projection (not shown) of the semiconductor channel 916 on the first substrate 110a overlaps with an orthogonal projection (not shown) of the gate 912 on the first substrate 110a. The source 918a and the drain 918b are disposed on the semiconductor channel 916 and separated from each other.

Herein, the material and the stacking sequence of the film layers constructing the active device 910 are not particularly limited in the present embodiment. In addition to the bottom gate type thin film transistor having the island-like channel shown in the present embodiment, the active device can be a bottom gate type thin film transistor having co-planar source and drain. Alternately, the active device can be a top gate type thin film transistor having co-planar source and drain or island-like channel.

Furthermore, the organic light emitting device 900 in the present embodiment can further include an insulation layer 920. The insulation layer 920 covers the active device 910 and has a contact window W exposing a portion of the drain 918b of the active device 910. Accordingly, the first electrode 132 of the organic light emitting unit 130 can be electrically connected to the drain 918b through the contact window W, which renders the active device 910 control the organic light emitting unit 130 to emit light or not.

In the present embodiment, the fabrication of the active device 910 requires several exposure processes for patterning the film layers (such as a first metal layer, a semiconductor layer, a second metal layer, and an insulation layer) into the required patterns constructing the gate 912, the semiconductor channel 916, the source 918a, the drain 918b and the window W. The energy of the exposure on the film layers constructing the active device 910 is different from the energy of the exposure on the first substrate 110a for forming the light guiding microstructures. Specifically, for the exposure on the first substrate 110a for forming the light guiding microstructures 112a, the energy of the light is in a range of 5 mW/cm$^2$ to 10 mW/cm$^2$, the wavelength of the light is from 100 nm to 200 nm, and the exposing time is from 3 minutes to 4 minutes. For patterning the photoresist to form the film layers constructing the active device 910, the energy of the exposing light is about 100 nW/cm$^2$, the wavelength of the light is from 350 nm to 450 nm, and the exposing time is from 10 seconds to 20 seconds. The exposure conditions such as the wavelength of the light and the thickness of the photoresist for fabricating the active device 910 can be controlled, which prevents the first light guiding microstructures 112a from an influence of the exposure during the fabrication of the active device 910. Accordingly, the shapes of the first light guiding microstructures 112a inside the first substrate 110a are not changed by the exposure process required for fabricating the active device 910.

In addition, the top and bottom emission type light emitting structure configured with the active device 910 in the present embodiment has no intend to limit the invention. In an alternate embodiment, the top emission type or the bottom emission type light emitting structure can selectively be configured with the active device 910. As for the top emission type light emitting structure configured with the active device 910, the device can be considered as the organic light emitting device 700 illustrated in FIG. 7 further having the active device 910 in FIG. 9. Herein, the second substrate 120*a* can selectively be made of the material other than the photosensitive material. In one instance, the second substrate 120*a* can be an opaque silicon substrate without light guiding microstructures. As such, the energy of the light adopted in the exposure for forming the film layers of the active device 910 has no influence on the first substrate 110*a*.

Figure 10:
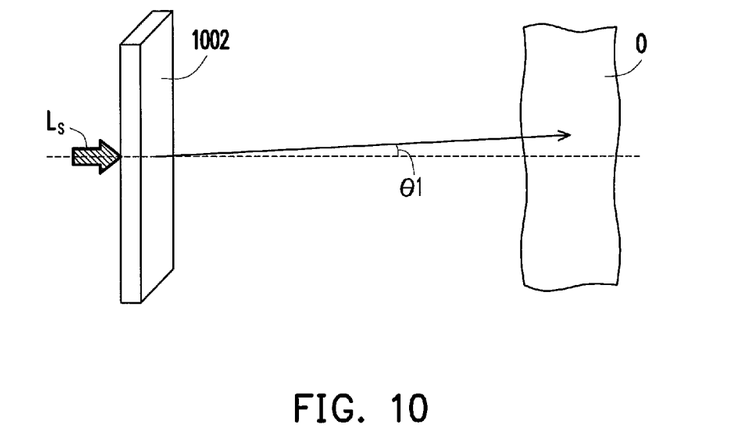
FIG. 10 and FIG. 11 schematically show the relationship between the distribution density of the light guiding microstructures inside a substrate and the refraction of the light passing through the substrate.
Figure 11:
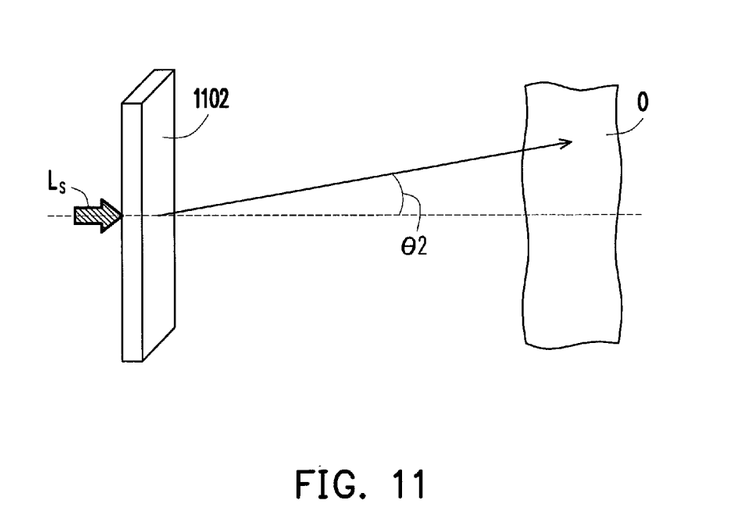

Furthermore, for further describing the refraction effect of the light guiding microstructures according to the invention, FIG. 10 to FIG. 13 are further provided. FIG. 10 and FIG. 11 schematically show the relationship between the distribution density of the light guiding microstructures and the refraction of the light passing through the substrate with the light guiding microstructures.

In FIG. 10 and FIG. 11, a coherent light source is provided for simulation purpose and emits the light $L_s$. The refraction extents of the light $L_s$ passing through the regions having the light guiding microstructures of different distribution densities are compared. The fabrication of the first substrate illustrated in FIG. 10 and FIG. 11 can be referred to the above embodiment. Specifically, the materials of the first substrate 1002 in FIG. 10 and the first substrate 1002 in FIG. 11 are the photosensitive material. By the irradiation of the UV light on the two first substrates, the light guiding microstructures formed thereinside are distributed in different distribution densities. The light guiding microstructures inside the first substrate 1002 of FIG. 10 has the distribution density of 20 pcs/mm and the light guiding microstructures inside the first substrate 1002 of FIG. 11 has the distribution density of 200 pcs/mm. Each of the first substrate 1002 in FIG. 10 and the first substrate 1002 in FIG. 11 has at least two refractive indexes including the refractive index in the region where the light guiding microstructures is located and the refractive index in the region having no light guiding microstructures.

Referring to FIG. 10, after the light $L_s$ passing through the first substrate 1002, the refractive index distribution of the first substrate 1002 renders the light $L_s$ refracted at an angle θ1 and incident to a screen O. Similarly, referring to FIG. 11, after the light $L_s$ passing through the first substrate 1102, the refractive index distribution of the first substrate 1102 renders the light $L_s$ refracted at an angle θ2 and incident to the screen O. Based on those illustrated in FIG. 10 and FIG. 11, the refraction extent of light is increased with the increase of the distribution density of the light guiding microstructures. For example, the refraction angle of the light is increased from 2 degree to 20 degree when the distribution density of the light guiding microstructures is increased from 20 pcs/mm to 200 pcs/mm.

Figure 12:
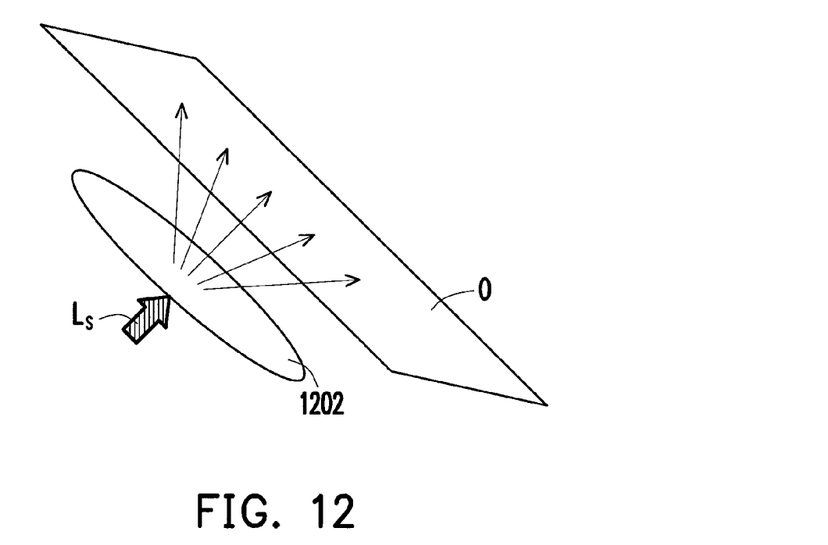
FIG. 12 and FIG. 13 schematically show the relationship between the distribution density of the light guiding microstructures inside a substrate and the light emitting efficiency of the light passing through the substrate.
Figure 13:
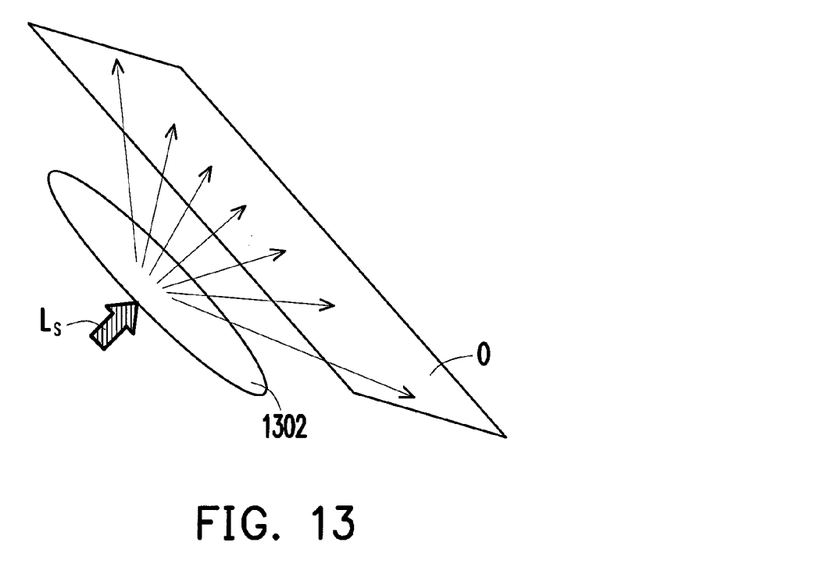

FIG. 12 and FIG. 13 schematically show the relationship between the distribution density of the light guiding microstructures and the light emitting efficiency of the light passing through the substrate with the light guiding microstructures.

In FIG. 12 and FIG. 13, an incoherent light source is provided for the simulation purpose and the light emitting efficiencies with and without the light guiding microstructures are compared. FIG. 12 shows the condition that the first substrate 1002 has no light guiding microstructures and FIG. 13 shows the condition that the first substrate 1002 has the light guiding microstructures, wherein the distribution density of the light guiding microstructures is 200 pcs/mm. In addition, the material and the fabrication of the first substrate 1302 in FIG. 13 are the same as those depicted in the above embodiments and are not reiterated.

Referring to FIG. 12, after the light $L_s$ passing through the first substrate 1202, the light $L_s$ of large angle may be subjected to the TIR effect and not irradiate on the screen O. Comparably, referring to FIG. 13, after the light $L_s$ passing through the first substrate 1302, the light $L_s$ of large angle may be subjected to the refraction effect of the light guiding microstructures and at least partially irradiate on the screen O, which reduces the proportion of the light Ls of large angle subjecting the TIR effect and incapable of emitting out so that the light emitting efficiency is enhanced.

In view of the above, the organic light emitting device according to the embodiment of the invention uses the substrate having different refractive indexes in the region where the light guiding microstructures are located and the region of the photo sensitive material without the light guiding microstructures, so as to refract the light at large angle. Therefore, less portion of the light emitted from the light emitting layer is restricted inside the organic light emitting device owing to the TIR effect of the substrate when the light emits out of the substrate at a large angle, which improves the light emitting efficiency. In addition, the light guiding microstructures inside the substrate is formed by irradiating the UV light passing through the patterned mask on the substrate of the photosensitive material so that no development agent or etchant is required to form the light guiding microstructures, which maintains the surface flatness of the substrate. The over large electric field or the shortening of the lifetime of the organic light emitting device caused by the poor surface evenness of the substrate is mitigated according to the embodiment of the invention. In addition, the light guiding microstructures need not be adhered on the surface of the substrate and/or between other film layers, and thus the problems owing to the misalignment during the adhesion process do not exist. The technique for forming the light guiding microstructures inside the substrate can be applied in the packaging substrate such as the second substrate in the above embodiments, so that the light emitting efficiency of the organic light emitting device at the top side or the bottom side can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic light emitting device, comprising:
   a first substrate having a plurality of first light guiding microstructures, a distribution density of the first light guiding microstructures being in a range of 100 to 2000 pcs/mm, wherein the first light guiding microstructures are located inside the first substrate and a material of the first substrate comprises a first photo-sensitive material;
   a second substrate disposed parallel to the first substrate; and
   an organic light emitting unit sandwiched between the first substrate and the second substrate.

2. The organic light emitting device as claimed in claim 1, wherein the first photo-sensitive material comprises rare metals, gold, silver or a combination thereof.

3. The organic light emitting device as claimed in claim 1, wherein a refractive index of the first substrate is in a range of 1.3 to 2.0.

4. The organic light emitting device as claimed in claim 1, wherein the first light guiding microstructures are distributed periodically.

5. The organic light emitting device as claimed in claim 4, wherein the distribution density of the first light guiding microstructures is in a range of 100 to 600 pcs/mm.

6. The organic light emitting device as claimed in claim 1, wherein the first light guiding microstructures are distributed non-periodically.

7. The organic light emitting device as claimed in claim 6, wherein the distribution density of the first light guiding microstructures is in a range of 1000 to 2000 pcs/mm.

8. The organic light emitting device as claimed in claim 1, wherein shapes of the first light guiding microstructures comprise rectangles, semicircles, triangles, or step-like shapes.

9. The organic light emitting device as claimed in claim 1, wherein the second substrate has a plurality of second light guiding microstructures, a distribution density of the second light guiding microstructures is in a range of 100 to 2000 pcs/mm, wherein the second light guiding microstructures are located inside the second substrate and a material of the second substrate comprises a second photo-sensitive material.

10. The organic light emitting device as claimed in claim 9, wherein the second photo-sensitive material comprises rare metals, gold, silver or a combination thereof.

11. The organic light emitting device as claimed in claim 9, wherein a refractive index of the second substrate is in a range of 1.3 to 2.0.

12. The organic light emitting device as claimed in claim 9, wherein the second light guiding microstructures are distributed periodically.

13. The organic light emitting device as claimed in claim 12, wherein the distribution density of the second light guiding microstructures is in a range of 100 to 600 pcs/mm.

14. The organic light emitting device as claimed in claim 9, wherein the second light guiding microstructures are distributed non-periodically.

15. The organic light emitting device as claimed in claim 14, wherein the distribution density of the second light guiding microstructures is in a range of 1000 to 2000 pcs/mm.

16. The organic light emitting device as claimed in claim 9, wherein shapes of the second light guiding microstructures comprise rectangles, semicircles, triangles, or step-like shapes.

17. The organic light emitting device as claimed in claim 1, wherein the organic light emitting unit comprises:
    a first electrode;
    a second electrode disposed parallel to the first electrode; and
    a light emitting layer disposed between the first electrode and the second electrode, wherein at least one of the first electrode and the second electrode is a transparent electrode.

18. The organic light emitting device as claimed in claim 1, further comprises an active device for driving the organic light emitting unit.

* * * * *